(12) United States Patent
Hallgren

(10) Patent No.: US 6,204,677 B1
(45) Date of Patent: Mar. 20, 2001

(54) CONTACT PRESSURE JIG FOR SIGNAL ANALYSIS

(75) Inventor: Bruce D. Hallgren, San Jose, CA (US)

(73) Assignee: Mosel Vitelic, Inc., Hsin (TW)

( * ) Notice: Subject to any disclaimer, the term of this patent is extended or adjusted under 35 U.S.C. 154(b) by 0 days.

(21) Appl. No.: 09/159,079

(22) Filed: Sep. 22, 1998

(51) Int. Cl.$^7$ .................. G01R 31/02; G01R 31/26
(52) U.S. Cl. .................. 324/757; 324/754; 324/765
(58) Field of Search .................. 324/538 AD, 754 AD, 324/755, 756, 757, 758, 759, 765, 158.1

(56) References Cited

U.S. PATENT DOCUMENTS

| | | | |
|---|---|---|---|
| 4,563,636 | * | 6/1986 | Snook et al. .................. 324/538 |
| 5,446,393 | * | 8/1995 | Schaefer .................. 324/754 |
| 5,489,854 | * | 2/1996 | Buck .................. 324/761 |
| 5,528,159 | * | 6/1996 | Charlton et al. .................. 324/758 |
| 5,552,701 | * | 9/1996 | Veteran et al. .................. 324/158.1 |
| 5,731,708 | * | 3/1998 | Shobhani .................. 324/758 |
| 5,949,238 | * | 9/1999 | Marquis .................. 324/754 |

* cited by examiner

Primary Examiner—Safet Metjahic
Assistant Examiner—Anjan K Deb
(74) Attorney, Agent, or Firm—Skjerven Morrill MacPherson LLP; David E. Steuber

(57) ABSTRACT

A testing apparatus has a load board and a device under test electrically interconnected with the load board. A pressure jig, which has a forcing unit and a structural member for fixing a fixed portion of the forcing unit with respect to the load board, also has a pressure actuating component moveable with respect to the fixed portion of the forcing unit. The pressure actuating component contacts the device under test. The apparatus may include a probe that contacts a terminal of the device under test for monitoring the signal state of the terminal as the device under test interacts with the load board.

17 Claims, 1 Drawing Sheet

CONTACT PRESSURE JIG FOR SIGNAL ANALYSIS

BACKGROUND OF THE INVENTION

Integrated circuits are designed to meet certain design specifications. Integrated circuits are tested before they are sold to determine whether they meet the design specifications. For relatively simple devices (i.e., devices with only a few input and output terminals (e.g., pins)), a test may involve applying signals to the input terminals, measuring the response on the output terminals, and comparing the actual response to the designed response. This comparison is performed for each permutation of input signals on the input terminals.

As errors are observed between the designed and actual output signal states, design problems in the device under test or in the load board may be pinpointed and remedied. Remedying the design problems of the device under test requires that the signals on the input and output pins of the device under test be monitored. One way of doing this uses an oscilloscope. A probe of the oscilloscope contacts each output pin for measuring the voltage on the output pin as the integrated circuit interacts with the load board. Unfortunately, some integrated circuits do not conventionally permit such monitoring. One such integrated circuit uses surface mounts such that terminals on the lower surface of the integrated circuit directly contact terminals on the upper surface of a socket. A lid over the integrated circuit compresses the terminals together when the lid is closed.

A problem with the conventional lidded surface mount device is that the surface mount integrated circuit can only interact with the load board when the lid, which covers all of the input and output terminals, is closed. Therefore, an oscilloscope probe is prevented from contacting the input or output terminals of the device under test while the device under test is interacting with the load board. Thus, the voltage states of the input and output terminals cannot be probed with the lid closed.

It is desirable to test the input/output signal characteristics of the surface mount integrated circuit as the circuit interacts with the load board.

SUMMARY OF THE INVENTION

An apparatus in accordance with the present invention includes a load board and a device under test electrically interconnected with the load board. The apparatus also includes a pressure jig. The pressure jig includes a forcing unit and a structural member configured to fix a fixed portion of the forcing unit with respect to the load board. The forcing unit also has a pressure actuating component moveable with respect to the fixed portion of the forcing unit. The pressure actuating component contacts the device under test. In one embodiment, the apparatus includes at least one probe that contacts the terminal.

In accordance with the present invention, a testing method includes compressing a device under test towards a load board using a pressure jig. The method includes contacting at least one probe to at least one terminal of the device under test while pressing.

In accordance with the present invention, a method of fabricating includes providing a load board and electrically interconnecting a device under test with the load board. A fixed portion of a forcing unit is fixed with respect to the load board. A device under test is forced towards the load board using a pressure actuating component of the forcing unit. In one embodiment, at least one probe is electrically coupled to at least one terminal of the device under test such that the probe(s) carry a signal representing the voltage level of the terminal(s).

This apparatus and these methods have the advantage of providing a testing apparatus in which electrical interaction between lidded circuits and a load board may be monitored.

These and other objects, features and advantages of the present invention will be more readily apparent from the detailed description of the preferred embodiments set forth below taken in conjunction with the accompanying drawings.

DESCRIPTION OF THE PREFERRED EMBODIMENTS

Several elements in the following figures are substantially similar. Similar reference numbers are used to represent the same or similar elements.

Figure 1:
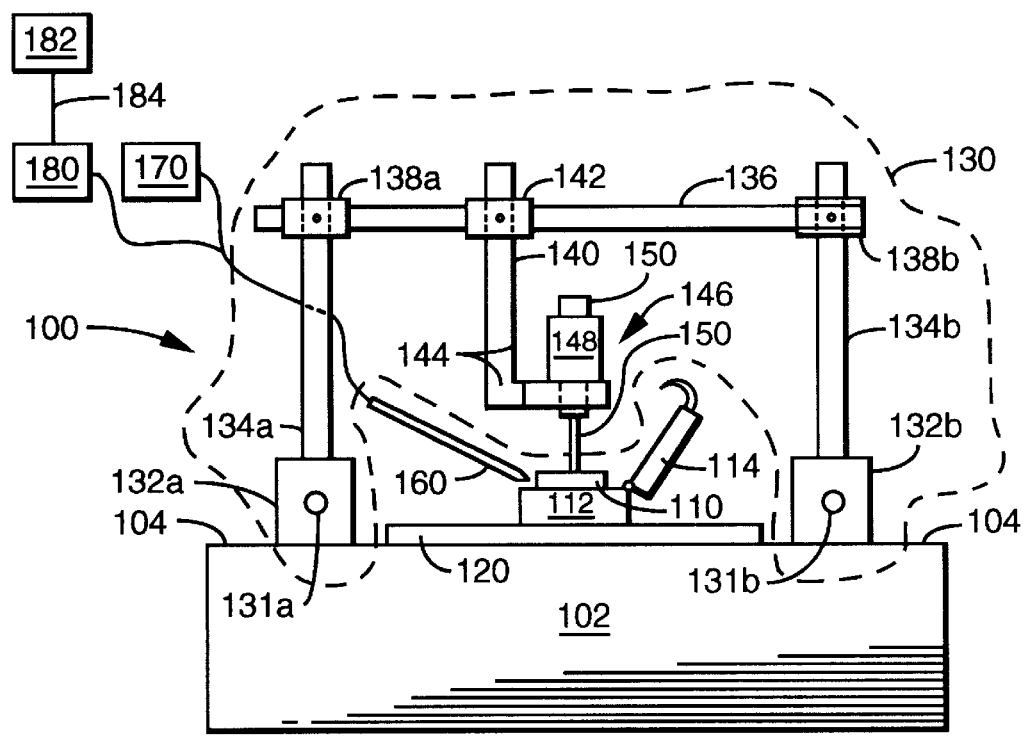
FIG. 1 is a schematic diagram of one embodiment of a testing apparatus of the present invention.

FIG. 1 is a diagram of one specific embodiment of a testing apparatus 100 of the present invention. As apparent from the following description, testing apparatus 100 monitors the signals at the terminals of a device under test 110 ("DUT 110") even when DUT 110 is a surface mount device. This testing apparatus 100 is also useful in testing any DUT 110 that requires pressing DUT 110 toward a load board 120 in order to secure reliable electrical interconnections between DUT 110 and load board 120.

Surface mounted devices are typically mounted in a socket, such as socket 112, and include a lid, such as lid 114. The surface mounted devices are pressed securely into socket 112 and toward load board 120 by closing and clamping lid 114 over socket 112. However, lid 114 is shown open in FIG. 1, and may even be removed completely in other embodiments.

Load board 120 contains circuitry representing circuitry of the ultimate working environment of DUT 110. Test head 102 structurally supports load board 120 and a contact pressure jig 130 (described hereinafter). Test head 102 may be set on a floor and may be, for example, two to four feet high so that the load board 120 is positioned within comfortable reach of a human operator. DUT 110 is electrically coupled to load board 120 via socket 112 mounted on load board 120.

In FIG. 1, during testing of DUT 110, compressive force is applied using the structure encompassed by dashed line 130 (hereinafter, contact pressure jig 130), not lid 114. Jig 130 includes left and right push button release magnetic bases 132a and 132b which are magnetically mounted to the top surface 104 of testing head 102. Magnetic mounting allows bases 132a and 132b to be quickly and easily mounted on and dismounted from test head 102. Of course, other mounting structures such as clamps, screws or bolts, for example, can also be used as appropriate, but may lack the simplicity and ease of use of magnetic mounting. Magnetic bases 132a and 132b may be, for example, part number 657-AA magnetic bases, including permanent magnets and mechanical switches 131a abd 131b, manufactured by L. S. Starrett Co. located in Athol, Mass.

Top surface 104 of test head 102 is composed of a material that is attracted to magnetic bases 132a and 132b, such as steel. Magnetic bases 132a and 132b are thus structurally mounted to test head 102.

Vertical structural members 134a and 134b are rigidly connected to respective magnetic bases 132a and 132b. Vertical structural members 134a and 134b may be, for example, 3/8 inch diameter steel rods. A horizontal structural member 136 is connected to vertical structural members 134a and 134b with, for example, respective swivel clamps 138a and 138b. Swivel clamps 138a and 138b may be, for example, part number 2242-A manufactured by L. S. Starrett Co. located in Athol, Mass. Horizontal structural member 136 may be, for example, a ½ inch diameter steel rod, and may be, for example, 26 inches long or longer. The span between magnetic bases 132a and 132b should be kept at a minimum to improve the rigidity of the pressure jig 130. Of course, other appropriate materials can also be used for structural members 134a, 134b and 136 if desired.

A vertical structural member 140 is connected to horizontal structural member 136 with swivel clamp 142 which may be the same design as swivel claims 138a and 138b. A micrometer 146 (e.g., part number 263 manufactured by L. S. Starrett Co. located in Athol, Mass.) is connected to vertical structural member 140 with swivel clamp 144. Swivel clamp may be, for example, part number 2242-A, manufactured by L. S. Starrett Co. in Athol, Mass. Micrometer 146, the forcing unit of the pressure jig 130, includes a micrometer sleeve 148 and a pressure actuating component such as micrometer spindle 150.

Micrometer 146 may be adjusted by rotating micrometer spindle 150 within micrometer sleeve 148 until micrometer spindle 150 applies enough compressive force to DUT 110 to mimic (i.e., simulate) actual operating conditions in which lid 114 is closed.

Spindle 150 should be relative long (e.g., over one inch) so that a probe 160, such as an oscilloscope probe, may have easy access to DUT 110. Of course, the longer the spindle 150, the easier the access. Probe 160 is electrically coupled to terminals of DUT 110 such that probe 160 carries signals representing the voltage on the terminals. For example, probe 160 may simply contact the terminals and thereby test the dynamic electrical interactions between the DUT 110 and load board 120. Electrical signals representing the states on the terminal of DUT 110 may be provided at an oscilloscope 170 where the signal's states may be visually reviewed. The electrical signals may also be provided to a processor 180 in which the actual signal levels are compared with reference design signal levels read from memory 182 over bus 184.

Figure 2:
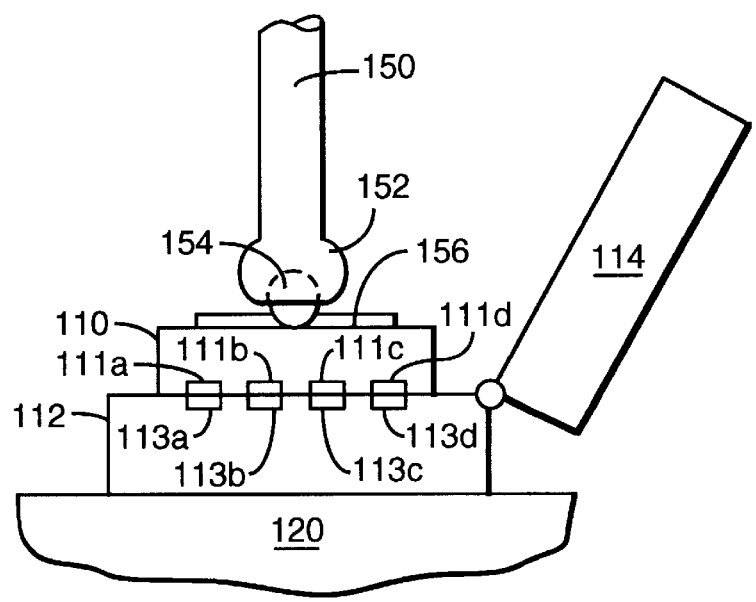
FIG. 2 is a detailed diagram of the device under test of FIG. 1 compressed such that the terminals of the device under test contact corresponding terminals of the socket of FIG. 1.

FIG. 2 is a detailed diagram of DUT 110 compressed such that terminals 111a, 111b, 111c and 111d contact corresponding terminals 113a, 113b, 113c and 113d of socket 112. Spindle 150 is equipped with a ball seating 152 having a ball 154 disposed within the ball seating 152. The ball 154 is free to rotate within ball seating 152 in any direction. The ball 154 and ball seating 152 may be, for example, part number 247-A manufactured by L. S. Starrett Co. located in Athol, Mass. The combination of ball seating 152 and ball 154 renders the spindle contact angle less critical since the contact area between ball 154 and DUT 110 is the same for a wide variety of spindle angles. Furthermore, spindle 150 may rotate without rotating ball 154. Therefore, substantially no torque is applied between ball 154 and DUT 110 as the spindle 150 pressure is adjusted by rotating spindle 150.

Ball 154 may also be fixed to a flat plate 156 to increase the contact area between micrometer 146 and DUT 110. Alternatively, plate 156 may have contours on its contact surface which apply forces in such a way that the chance of damage to DUT 110 is minimized. For example, flat plate 156 may be molded to exactly match the upper surface of DUT 110 so that forces are substantially evenly distributed across DUT 110.

The steps for analyzing problems and signal integrity in accordance with the present invention are now described. The steps described are not chronologically related unless expressly stated.

DUT 110 is placed in a position (hereinafter, "load position") with respect to load board 120 such that pressing DUT 110 toward load board 120 establishes electrical interconnections between DUT 110 and load board 120. The forcing unit, such as micrometer 146, is place in relatively close proximity to the load position. After being placed in relatively close proximity to the load position, and after DUT 110 is placed in the load position, the forcing unit presses DUT 110 toward load board 120 such that reliable interconnections are established between terminals 111a, 111b, 111c and 111d and terminals 113a, 113b, 113c and 113d.

After DUT 110 is pressed toward load board 120, testing is performed by monitoring the electrical interactions between DUT 110 and load board 120. For example, probe 160 is brought into contact with one or more of terminals 111a, 111b, 111c and/or 111d of DUT 110. Signal levels are observed on an oscilloscope 170.

After testing is complete, the forcing unit is brought out of contact with DUT 110 by, for example, screwing back micrometer spindle 150 out of contact with DUT 110, pushing the release buttons 131a and 131b of magnetic bases 132a and 132b, respectively, and lifting the pressure jig 130 away from testing head 102.

Although a specific embodiment of the present invention is described above, persons skilled in the art will recognize that changes may be made in form and detail without departing from the spirit and scope of the invention.

For example, although pressure jig 130 is described in detail, magnetic bases 132a and 132b may be mounted to the sides or bottom surface of test head 102. Magnetic bases 132a and 132b may by secured to an object, other than the test head 102, which object is substantially fixed relative to the test head 102.

Although pressure jig 130 is described as being mounted magnetically to test head 102, other mounting mechanisms may be used to attach pressure jig 130 to test head 102. For example, pressure jig 130 may be bolted to test head 102.

Although the forcing unit of pressure jig 130 is described as being a micrometer 146, other forcing units may be used such as a pneumatic or hydraulic piston.

Thus the invention is limited only by the following claims.

I claim:

1. An apparatus comprising:
   a load board;
   a device under test electrically interconnected with the load board, the device under test having at least one terminal capable of being directly contacted by a probe of a measurement device; and
   a pressure jig comprising:
      a forcing unit; and
      a structural member configured to fix a fixed portion of the forcing unit with respect to the load board, the forcing unit having a pressure actuating component moveable with respect to the fixed portion of the forcing unit, the pressure actuating component contacting the device under test.

2. The apparatus of claim 1, wherein the apparatus is portable.

3. The apparatus of claim 2, further comprising an oscilloscope connected to the at least one probe, the oscilloscope configured to display a representation of a voltage level on the at least one probe, said voltage level being representative of the voltage level on the at least one terminal.

4. The apparatus of claim 1, wherein the portion of the forcing unit comprises a micrometer sleeve, wherein the moveable component of the forcing unit comprises a micrometer spindle.

5. The apparatus of claim 4, wherein the micrometer spindle comprises a ball seating disposed at an end of the micrometer spindle, a ball being disposed within the ball seating.

6. The apparatus of claim 5, wherein the ball is fixed to a substantially flat plate, the substantially flat plate having a lower surface contacting the device under test.

7. A method comprising:

contacting a device under test with a pressure actuating component of a pressure jig;

pressing the device under test towards a load board using the pressure actuating component; and while pressing, directly contacting at least one probe of a measurement device to at least one terminal of the device under test.

8. The method of claim 7, wherein pressing comprises pressing a surface mounted device towards the load board, the method further comprising:

maintaining a lid of the surface mounted device in an open position.

9. The method of claim 7, wherein pressing comprises:

pressing the device under test towards the load board until terminals of the device under test are electrically coupled to the load board.

10. The method of claim 7, wherein directly contacting at least one probe of a measurement device comprises:

directly contacting at least one oscilloscope probe to the at least one terminal of the device under test.

11. The method of claim 7, further comprising:

comparing signal states on the at least one probe with signal states stored in a memory.

12. A method comprising:

providing a load board;

electrically interconnecting a device under test with the load board;

fixing a fixed portion of a forcing unit with respect to the load board;

contacting the device under test with a pressure actuating component of the forcing unit;

forcing the device under test towards the load board using the pressure actuating component of the forcing unit; and directly contacting at least one probe of a measurement device to at least one terminal of the device under test thereby electrically coupling the at least one probe to the at least one terminal such that the at least one probe carries a signal representing the voltage level of the at least one terminal.

13. The method of claim 12, further comprising:

electrically coupling the at least one probe to an oscilloscope.

14. The method of claim 12, further comprising:

electrically coupling the at least one probe to a processor.

15. The method of claim 12, wherein fixing comprises:

fixing a fixed portion of a micrometer with respect to the load board; and wherein forcing comprises:

forcing the device under test towards the load board using a pressure actuating component of the micrometer.

16. A method comprising:

pressing the device under test towards a load board using a pressure jig; and while pressing, directly contacting at least one probe of a measurement device to at least one terminal of the device under test.

17. An apparatus comprising:

a load board;

a device under test electrically interconnected with the load board, the device under test having at least one terminal;

a forcing unit;

a horizontal structural member fixed with respect to the load board; and a vertical structural member fixed with respect to the load board, coupled to the horizontal member, and configured to fix a fixed portion of the forcing unit with respect to the load board, the forcing unit having a pressure actuating component moveable with respect to the fixed portion of the forcing unit, the pressure actuating component contacting the device under test.

* * * * *

UNITED STATES PATENT AND TRADEMARK OFFICE
CERTIFICATE OF CORRECTION

PATENT NO. : 6,204,677 B1
DATED : March 20, 2001
INVENTOR(S) : Hallgren, Bruce D.

It is certified that error appears in the above-identified patent and that said Letters Patent is hereby corrected as shown below:

<u>Column 3,</u>
Line 36, delete "relative" and insert -- relatively --.

<u>Column 4,</u>
Line 15, delete "place" and insert -- placed --.

Signed and Sealed this

Ninth Day of April, 2002

Attest:

*Attesting Officer*

JAMES E. ROGAN
*Director of the United States Patent and Trademark Office*